(12) United States Patent
Chen

(10) Patent No.: US 9,299,626 B2
(45) Date of Patent: Mar. 29, 2016

(54) DIE PACKAGE STRUCTURE

(71) Applicant: Innovative Turnkey Solution Corporation, Hsinchu (TW)

(72) Inventor: Shih-Chi Chen, Hsinchu (TW)

(73) Assignee: Shi-Chi Chen, Zhubei, Hsinchu County (TW)

( * ) Notice: Subject to any disclaimer, the term of this patent is extended or adjusted under 35 U.S.C. 154(b) by 127 days.

(21) Appl. No.: 13/920,468

(22) Filed: Jun. 18, 2013

(65) Prior Publication Data

US 2014/0197524 A1 Jul. 17, 2014

(30) Foreign Application Priority Data

Jan. 16, 2013 (TW) .............................. 102200928 A

(51) Int. Cl.
| | |
|---|---|
| *H01L 23/48* | (2006.01) |
| *H01L 23/13* | (2006.01) |
| *H01L 23/495* | (2006.01) |
| *H01L 23/498* | (2006.01) |
| *H01L 23/31* | (2006.01) |
| *H01L 23/28* | (2006.01) |
| *H01L 23/00* | (2006.01) |

(52) U.S. Cl.
CPC ............ *H01L 23/13* (2013.01); *H01L 23/4951* (2013.01); *H01L 23/4985* (2013.01); *H01L 24/94* (2013.01); *H01L 24/97* (2013.01); *H01L 23/28* (2013.01); *H01L 23/31* (2013.01); *H01L 23/3114* (2013.01); *H01L 23/3121* (2013.01); *H01L 24/06* (2013.01); *H01L 24/32* (2013.01); *H01L 24/48* (2013.01); *H01L 24/49* (2013.01); *H01L 24/73* (2013.01); *H01L 24/85* (2013.01); *H01L 2224/04042* (2013.01); *H01L 2224/05554* (2013.01); *H01L 2224/06136* (2013.01); *H01L 2224/32225* (2013.01); *H01L 2224/32245* (2013.01); *H01L 2224/451* (2013.01); *H01L 2224/4824* (2013.01); *H01L 2224/4826* (2013.01); *H01L 2224/48091* (2013.01); *H01L 2224/49171* (2013.01); *H01L 2224/73215* (2013.01); *H01L 2224/85544* (2013.01); *H01L 2924/00014* (2013.01); *H01L 2924/14* (2013.01); *H01L 2924/1433* (2013.01); *H01L 2924/1438* (2013.01); *H01L 2924/15311* (2013.01); *H01L 2924/18165* (2013.01)

(58) Field of Classification Search
CPC ................................................ H01L 23/49568
See application file for complete search history.

(56) References Cited

U.S. PATENT DOCUMENTS

| | | | | |
|---|---|---|---|---|
| 5,420,460 | A * | 5/1995 | Massingill .................... | 257/693 |
| 2003/0207501 | A1* | 11/2003 | Schoenfeld et al. .......... | 438/128 |
| 2007/0164411 | A1* | 7/2007 | Huang et al. .................. | 257/678 |

\* cited by examiner

*Primary Examiner* — William Harriston
(74) *Attorney, Agent, or Firm* — Muncy, Geissler, Olds & Lowe, P.C.

(57) ABSTRACT

A die packaged structure includes a pad on the central region of the die. A packaged substrate with an opening disposed in the central region, and a connecting terminal is passed through the packaged substrate and disposed around the opening. An external connecting terminal is disposed on the four sides of the packaged substrate. A first metal wire is electrically connected the connecting terminal with the external connecting terminal, and the back of the packaged substrate is fixed on the die, such that the pad is exposed on the opening. A second metal wire is electrically connected the pad with the connecting terminal. A packaged body is encapsulated the packaged substrate, the die and the second metal wire, and the external connecting terminal is exposed. A conductive component is electrically connected with the external connecting terminal and is arranged on the four sides of the die packaged structure.

5 Claims, 13 Drawing Sheets

DIE PACKAGE STRUCTURE

FIELD OF THE INVENTION

The present invention relates to a die packaged structure which is formed by wafer level packaging process and simple wire bonding process, and in particular to a memory die utilizes wire bonding process to form a die packaged structure.

BACKGROUND OF THE INVENTION

The development of semiconductor technology is very fast, in particular, a semiconductor dices tends to miniaturization of the tendency. However, the function requirement of semiconductor dice also tends to the diversification. In other words, a smaller region of the semiconductor dice requires more input/out pads so as to the density of the pins is increased quickly. Thus, the semiconductor dices is difficult to package and the yield is to be decreased.

The mainly propose of the packaged structure is for preventing the die from the damage. However, each the plurality of dies is formed by cutting the wafer, and packaging and testing each the plurality of dies. In addition, another package technology, which is called "Wafer Level Package, WLP", is used to package before the wafer is cut into a plurality dies. The wafer level package technology has several advantages such as short production cycle, lower cost, and no under-filler.

SUMMARY OF THE INVENTION

The mainly objective of the present invention is to provide a die packaged structure. A packaged substrate is fixed on the die after alignment process, such that the pad in the central region of the die is exposed on the opening in the central region of the packaged substrate. Then, an external connecting terminal on the packaged substrate is to be exposed after packaging process by a package body, so as a die packaged structure with a packaged substrate can be obtained.

Another objective of the present invention is to provide a die packaged structure, particularly to suitable for large scale die packaged process, such as memory, in particular to an NAND flash memory chip, NOR flash memory chip, communication IC chip, and several application-specific IC chip.

An objective of the present invention is to provide a die packaged structure. A plurality of external connecting terminals is exposed on one surface of the die packaged structure, and can be used as the external connecting endpoint to electrically connect with other component. With respect to the other surface of the plurality of external connecting terminals is the back surface of the die. Thus, the die packaged structure can achieve good heat dissipation effect, and good heat dissipation is very important for large scale IC chip According to above objectives, the present invention provides a die packaged structure, which includes a die having an active surface and a back surface, and a plurality of pads in a central region of the active surface of the die. A packaged substrate having an opening in a central region therein, a plurality of connecting terminals is disposed around the opening, and a plurality of external connecting terminals is disposed on four sides of the packaged substrate, in which the plurality of connecting terminals is electrically connected with the plurality of external connecting terminals by a plurality of first metal wires. The back surface of the packaged substrate is fixed on the die by an adhesive layer, such that the plurality of pads in the central region of the die is exposed on the opening of the packaged substrate. A plurality of second metal wires is electrically connected the plurality of connecting terminals in the central region of the packaged substrate with the plurality of pads in the central region of the die. A packaged body is encapsulated the packaged substrate, the die and the plurality of second metal wires, and the plurality of external connecting terminals on the packaged substrate is to be exposed. A plurality of conductive components is then electrically connected with the plurality of external connecting terminals and is arranged on the four sides of the packaged substrate.

The present invention also provides another die packaged structure, which includes a die having an active surface and a back surface, and a plurality of pads in the central region of the active surface of the die. A packaged substrate having an opening in a central region, a plurality of connecting terminals is disposed around the opening, and a plurality of external connecting terminals is disposed on four sides of the packaged substrate, and a plurality of connecting terminals is electrically connected with the plurality of external connecting terminals by a plurality of first metal wires, in which the back surface of the package substrate is fixed on the die by an adhesive layer, such that the plurality of pads in the central region of the die is exposed on the opening of the packaged substrate, and the length of each the plurality of external connecting terminals on the packaged substrate is extended outwardly larger than that of one side of the die. A plurality of second metal wires is electrically connected the plurality of connecting terminals in the central region of the packaged substrate with the plurality of pads in the central region of the die. A package body is encapsulated the packaged substrate, the active surface of the die and the plurality of second metal wires, and the plurality of external connecting terminals is exposed outside of the packaged body.

BRIEF DESCRIPTION OF THE DRAWINGS

The present invention will be apparent to those skilled in the art by reading the following description of a preferred embodiment thereof with reference to the drawings, in which:

FIG. 2B shows a packaged substrate is combined with the die, and the packaged substrate having a plurality of connecting terminals and a plurality of metal traces thereon.

DETAILED DESCRIPTION OF THE PREFERRED EMBODIMENT

The present invention provides a die packaged structure, in particular to a wafer level packaged structure is formed by using simple wire bonding process, and thus, such wafer level packaged structure can be referred to Wire-bonding Chip Scale Package (WBCSP), which can apply for large chip packaged structure. The cost can also be saved due to the simple packaged structure.

Some of the detail embodiments of the present invention will be described below. However, beside the detail description, the present invention can be generally used in other embodiments.

Figure 1:
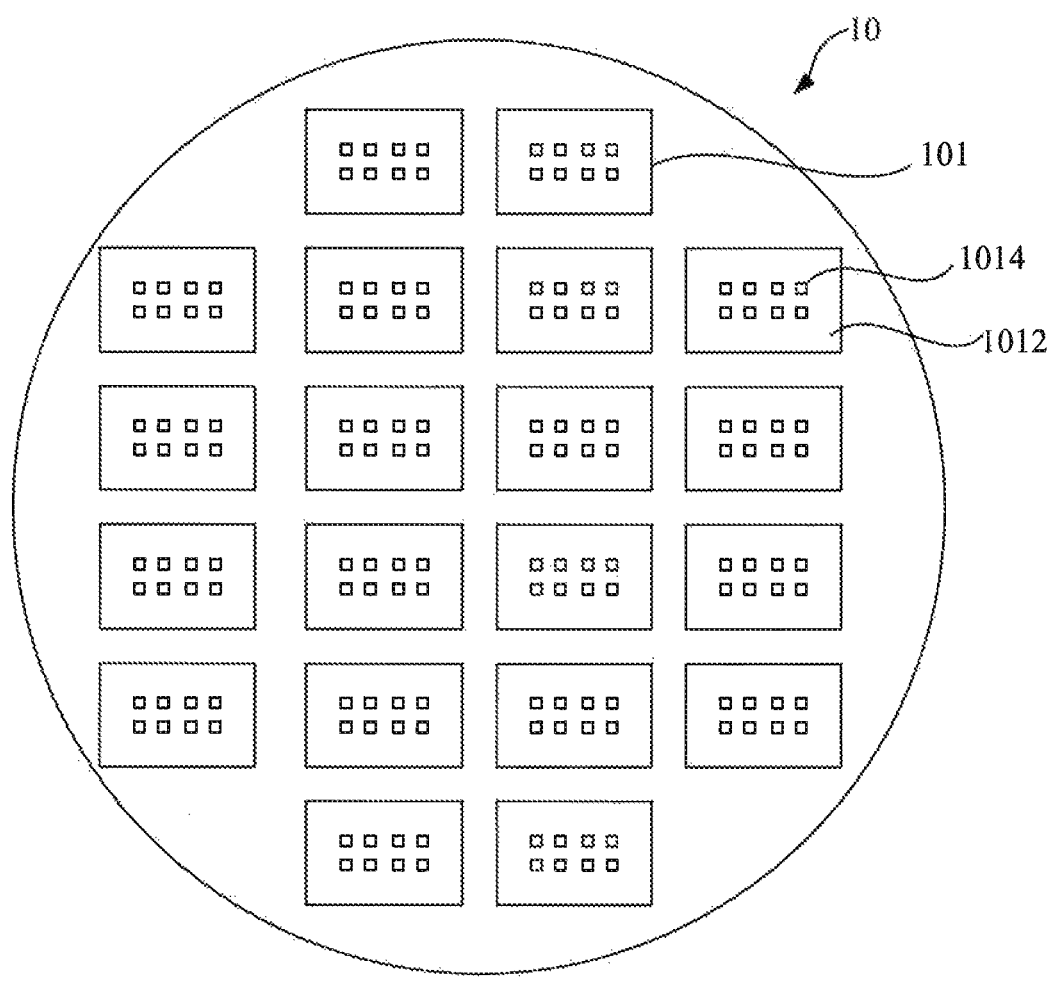
FIG. 1 is a vertical view of a wafer having a plurality of dies thereon.

Please refer to FIG. 1. FIG. 1 is a vertical view of a wafer having a plurality of dies. As shown in FIG. 1, the wafer 10 having a plurality of dies 101 thereon. Each the plurality of dies 101 has an active surface 1012 and a back surface (not shown). A plurality of pads 1014 is disposed in the central region of the active surface 1012 of the die 101, in which each the plurality of pads 1014 is formed by redistribution layer process on the active surface 1012 of the die 101. It is noted to illustrate that the plurality of dies 101 of the wafer 10 has completed the semiconductor manufacturing process, and each the plurality of dies 101 such as NAND flash memory, NOR flash memory, communication IC or application-specific IC, which can be formed by large scale chip manufacturing process.

In the embodiment of the present invention with the flash memory to illustrate, in particular to a NAND flash memory with 48 pins. In addition, the manufacturing process and the redistribution layer process is not a main feature in this present invention, and thus it will not describe herein.

Figure 2A:
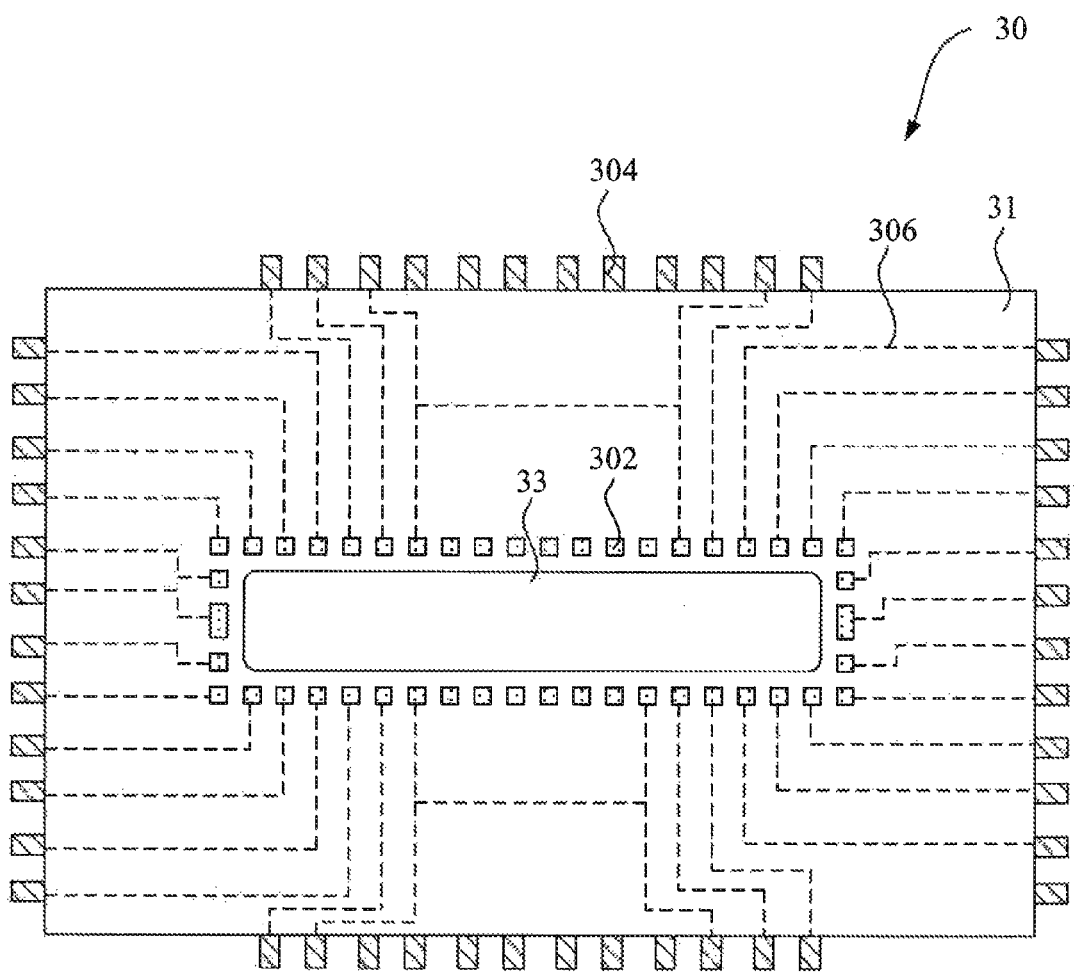
FIG. 2A is a vertical view of a front surface of packaged substrate.

Then, please refer to FIG. 2A. FIG. 2A is a vertical view of a front surface of the packaged substrate. The packaged substrate 30 having a front surface 31 and a back surface 32, and an opening 33 is formed in the central region of the packaged substrate 30 which is used to expose the plurality of pads 1014 on the central region of the die 101 when the packaged substrate 30 is combined with the die 101. A plurality of connecting terminals 302 is disposed around the four sides of the opening 33 and a plurality of external connecting terminals 304 is disposed on four sides of the packaged substrate 30, in which the plurality of external connecting terminals 304 is passed through the front surface and the back surface of the packaged substrate 40. In this embodiment of the invention, the plurality of connecting terminals 302 can be golden finger or metal trace, and each the plurality of connecting terminals 302 can be isolated from each other by an insulating material (for example, plastic material) (not shown) or ceramic (not shown).

In addition, in this embodiment, the packaged substrate 30 can be a flexible print circuit board or a rigid substrate. Furthermore, for the rigid substrate, the packaged substrate 30 can be a single layer print circuit board (PCB) or a multi-layer print circuit board. For the flexible print circuit board, the flexible print circuit board can be made of polymeric material and lead frame.

Figure 2B:
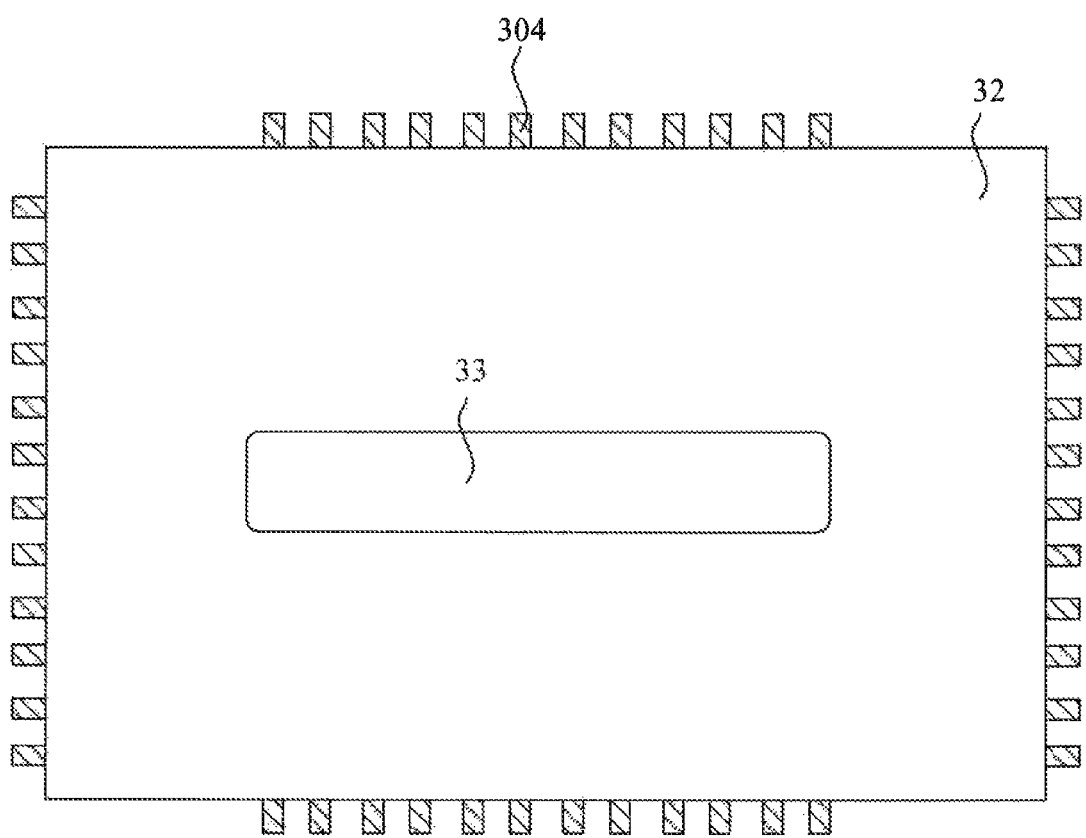
FIG. 2B is a vertical view of a back surface of the packaged substrate.

Next, please refer to FIG. 2B. FIG. 2B is a vertical view of a back surface of the packaged substrate. In FIG. 2B, a plurality of external connecting terminals 304 that is disposed on the four sides of the back surface 32 of the packaged substrate 30.

Figure 3:
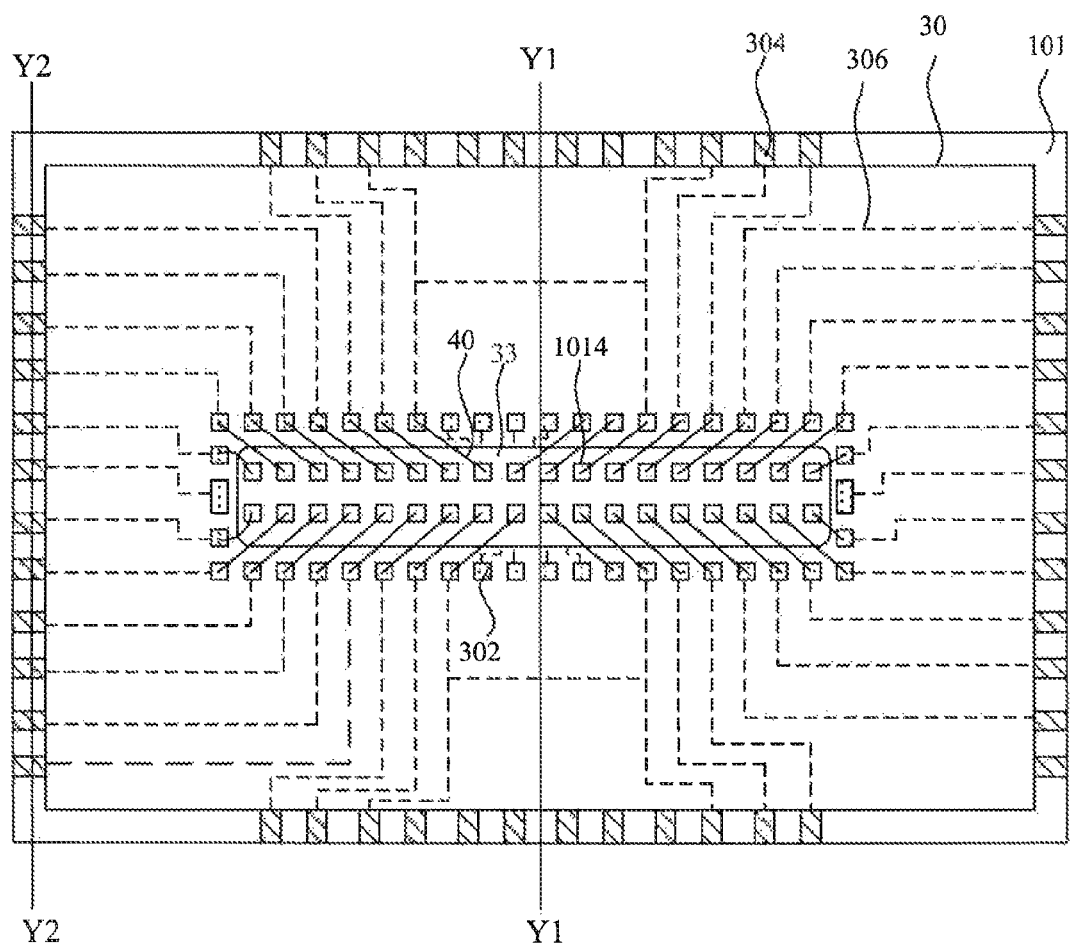
FIG. 3 is a vertical view of FIG. 2A and FIG. 2B of the packaged substrate is combined with the die, and the packaged substrate having the plurality of connecting terminals and the plurality of traces thereon.

Then, please refer to FIG. 3. FIG. 3 is a vertical view of FIG. 2A and FIG. 2B which illustrates a packaged substrate is combined with the die, in which the packaged substrate having a plurality of connecting terminals and a plurality of metal traces thereon. In FIG. 3, an opening 33 is formed in the central region of the front surface 31 of the packaged substrate 30, and a plurality of connecting terminals 302 is disposed around the opening 33. In addition, a plurality of external connecting terminals 304 is disposed on four sides of the packaged substrate 30, and the plurality of external connecting terminals 304 is electrically connected with the plurality of connecting terminals 304 by a plurality of first metal traces 306.

Then, please also refer to FIG. 3. In this embodiment of the invention, because of the size of the packaged substrate 30 is smaller than that of the die 101, the plurality of pads 1014 in the central region of the die 101 is to be exposed on the opening 33 in the central region of the packaged substrate 30 when the back surface 32 of the packaged substrate 30 is fixed on the die 101 by an adhesive layer (not shown). In addition, the length of the plurality of external connecting terminals 34 on four sides of the packaged substrate 30 can be larger than or identical to that of the side of the die 101.

Also, please refer to FIG. 3. When the packaged substrate 30 is combined with the die 101, each the plurality of connecting terminals 302 on the packaged substrate 30 and each plurality of pads 1014 on the active surface 1012 of the die 101 are to be expose and arranged corresponding to each other. Then, a plurality of second metal wires 40 is formed to electrically connect each plurality of connecting terminals 302 on the packaged substrate 30 with each the plurality of pads 1014 on the die 101.

Figure 4A:
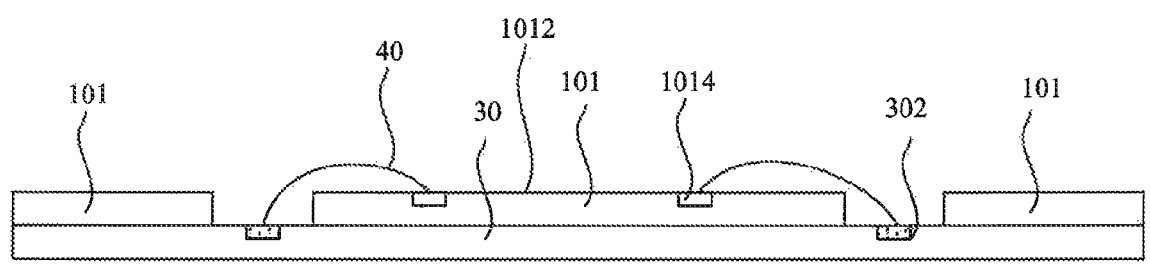
FIG. 4A is a cross-sectional view of Y1-Y1 direction in FIG. 3.
Figure 4B:
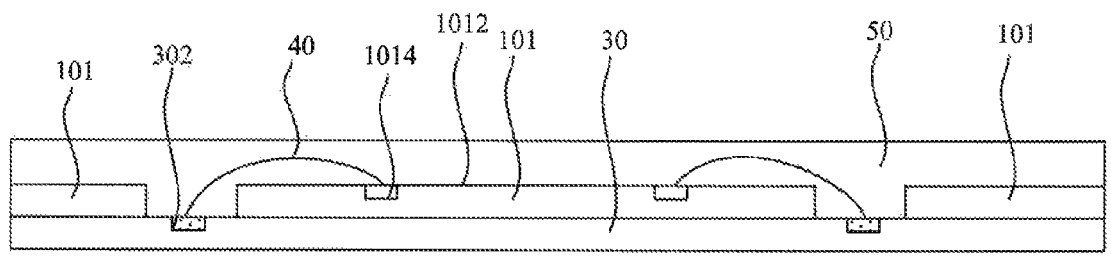
FIG. 4B is a cross-sectional schematic illustrates a packaged body is formed by a structure of FIG. 4A.

Please refer to FIG. 4A. FIG. 4A is a cross-sectional view of Y1-Y1 direction in FIG. 3. FIG. 4A shows the packaged substrate 30 that is disposed on the die 101 in Y1-Y1 direction in FIG. 3 after wire bonding process. Then, please refer to FIG. 4B. FIG. 4B shows a packaged material that is formed on the packaged substrate 30 to form a packaged body 50 by a screen printing process, in which the packaged body 50 encapsulated the packaged substrate 30, the plurality of second metal wires 40 and the portion active surface 1012 of the die 101.

Figure 5A:
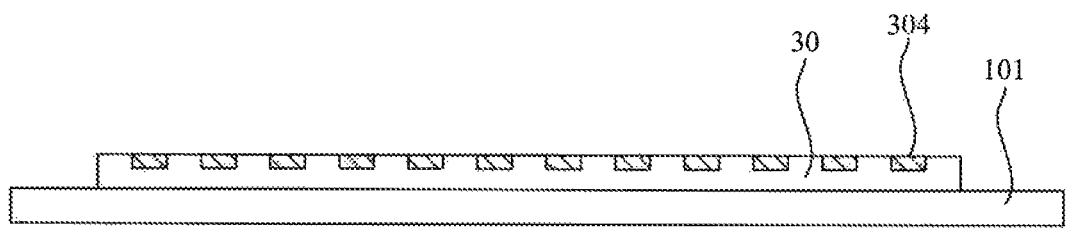
FIG. 5A is a cross-sectional view of Y2-Y2 direction in FIG. 3.

Moreover, please refer to FIG. 5A. FIG. 5A shows a cross-sectional view of Y2-Y2 direction in FIG. 3. In FIG. 5A, we can obtain the plurality of external connecting terminals 304 on the packaged substrate 30 in Y2-Y2 direction when the cross-section in Y2-2 direction in FIG. 3 (which is cross-section on the plurality of external connecting terminals 304) after wire bonding process. In FIG. 5, the plurality of external connecting terminals 304 can be optionally exposed (that is to say, the packaged body 50 is not encapsulated the plurality of external connecting terminals 304), or the plurality of external connecting terminals 304 is encapsulated by the packaged body 50 first, and then the plurality of external connecting terminals 304 is exposed by a semiconductor manufacturing process. The formation steps of the packaged body 50 is not to be limited in this invention, in addition, the material of the packaged body 50 is also not to be limited herein.

Figure 5B:
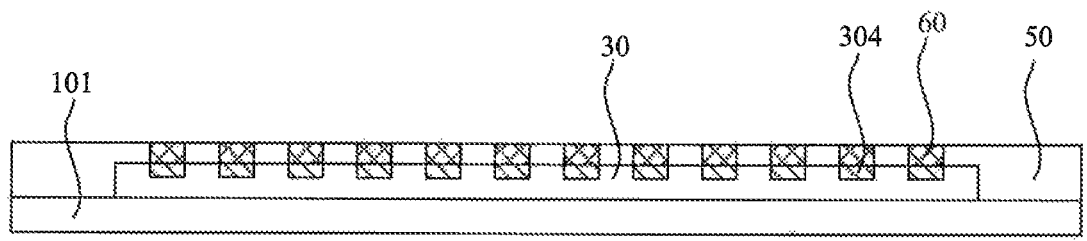
FIG. 5B is a cross-sectional schematic illustrates a conductive component is formed on the structure of FIG. 5A.

Please also refer to FIG. 5B. After the plurality of external connecting terminals 304 is exposed, and screen printing process is accomplished, a plurality of conductive components 60 is disposed on the plurality of external connecting terminals 304 on the packaged substrate 30 by an electroplating process. The height of the plurality of conductive components 60 is larger than or is identical to total height of the packaged substrate 30 and the packaged body 50. In addition, the bump process can be select to form the plurality of conductive components 60 on the plurality of external connecting terminals 60, in which the plurality of conductive components 60 can be the bump.

It is noted to illustrate that FIG. 5B is a cross-sectional view of Y2-Y2 direction in FIG. 3, such that the packaged body 50 is disposed between each the plurality of external connecting terminals 304 of the packaged substrate 30, and each the plurality of conductive components 60 is disposed on each the plurality of external connecting terminals 304.

Figure 5C:
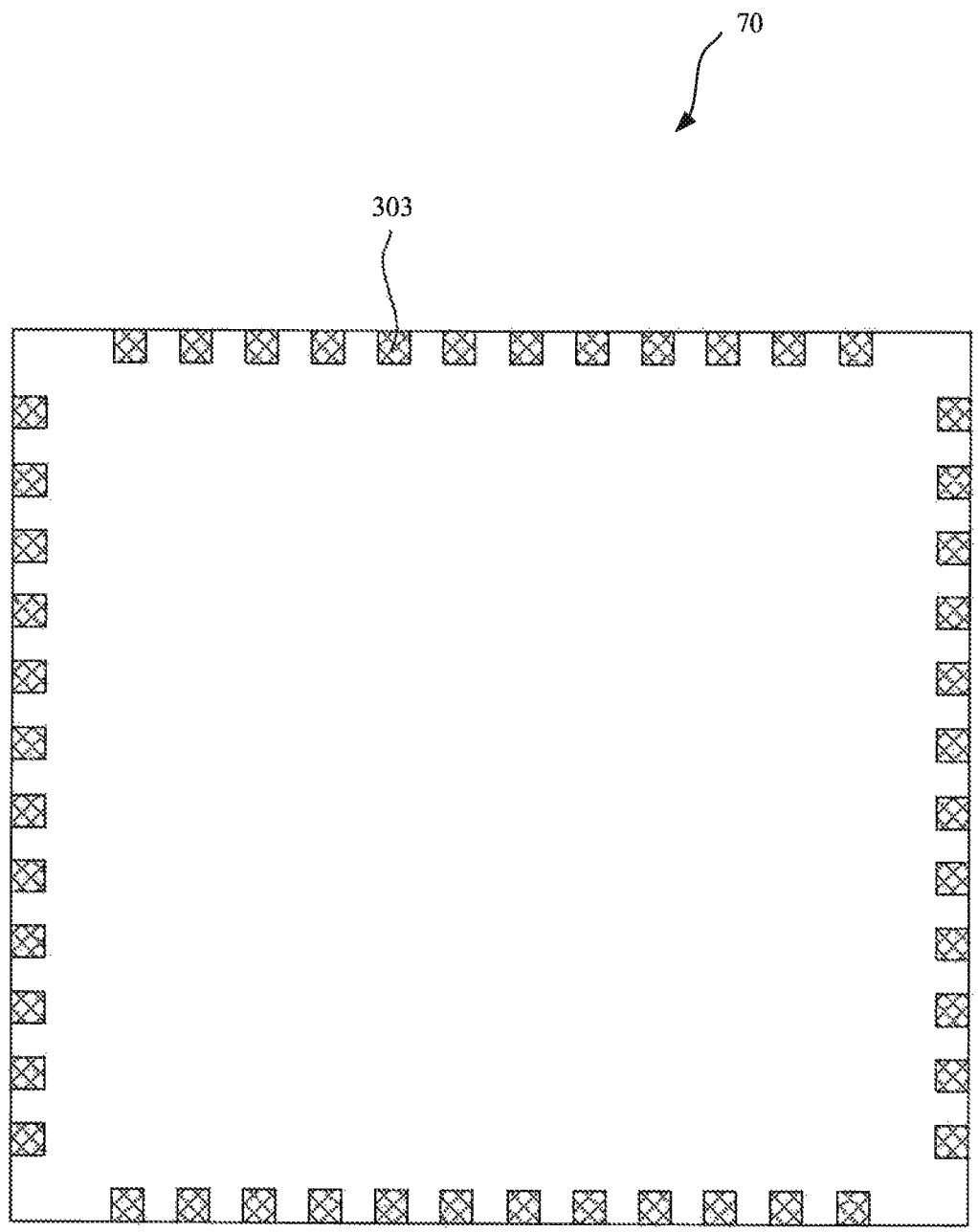
FIG. 5C is a cross-sectional schematic illustrates a back surface of the packaged substrate after an electroplating process is completed.

Then, FIG. 5C is a cross-sectional view of a back surface of the packaged substrate after completing the electroplating process. In FIG. 5C, the plurality of external connecting terminals 304 is arranged on one side of the die packaged structure 70, and the cross-sectional view of die packaged structure 70 is shown in FIG. 5B.

Obviously, for the die packaged structure 70 of the invention, the plurality of external connecting terminals 304 (not shown in FIG. 5C) is exposed on one surface of the die packaged structure 70 and can be used as the connecting endpoint to electrically connect with the external component (not shown), and another surface is the back surface 1012 of the die 101 which can be used as the heat dissipation to achieve good heat dissipation effect, and the good heat dissipation effect is very important for the large scale IC chip It is noted to illustrate that although the die packaged structure 70 is formed by a single packaged substrate 30 and a single die 101 according to above FIG. 1 to FIG. 5C. In fact, for an embodiment of the invention, the packaging process utilizes a well-designed circuit board (not shown) with a plurality of packaged substrate 30 that is arranged on the entire Wafer 10. Thus, according to above formation steps, the entire packaged structure is to be completed after the plurality of conductive components 60 is formed on the plurality of external connecting terminals 304 as shown in FIG. 5C. Then, the sawing process with the cutter (not shown) is performed to cut the entire packaged structure into a plurality of die packaged structures 70. In this embodiment, the plurality of die packaged structures 70 is especially for flash NAND memory packaged structure.

In addition, the present invention also provides another embodiment of the die packaged structure, in which the manufacturing process is similar to FIG. 1 to FIG. 5C and it is not to be described herein. The different between abovementioned is that the sawing process is first cut the wafer 10 to obtain the plurality of dies 101. In addition, another sawing process is cut the circuit board (not shown) to obtain a plurality of packaged substrates 30. Then, each the plurality of packaged substrates 30 is arranged and fixed on each the plurality of dies 101 to obtain the structure as the vertical view of FIG. 6. It is noted to illustrate that the formations steps of the metal traces (not shown) on the packaged substrate 30 and the formation steps of the packaged substrate 30 on the die 101 is similar to above FIG. 1 to FIG. 5C, and thus, it is not to be described in detail herein.

Figure 6:
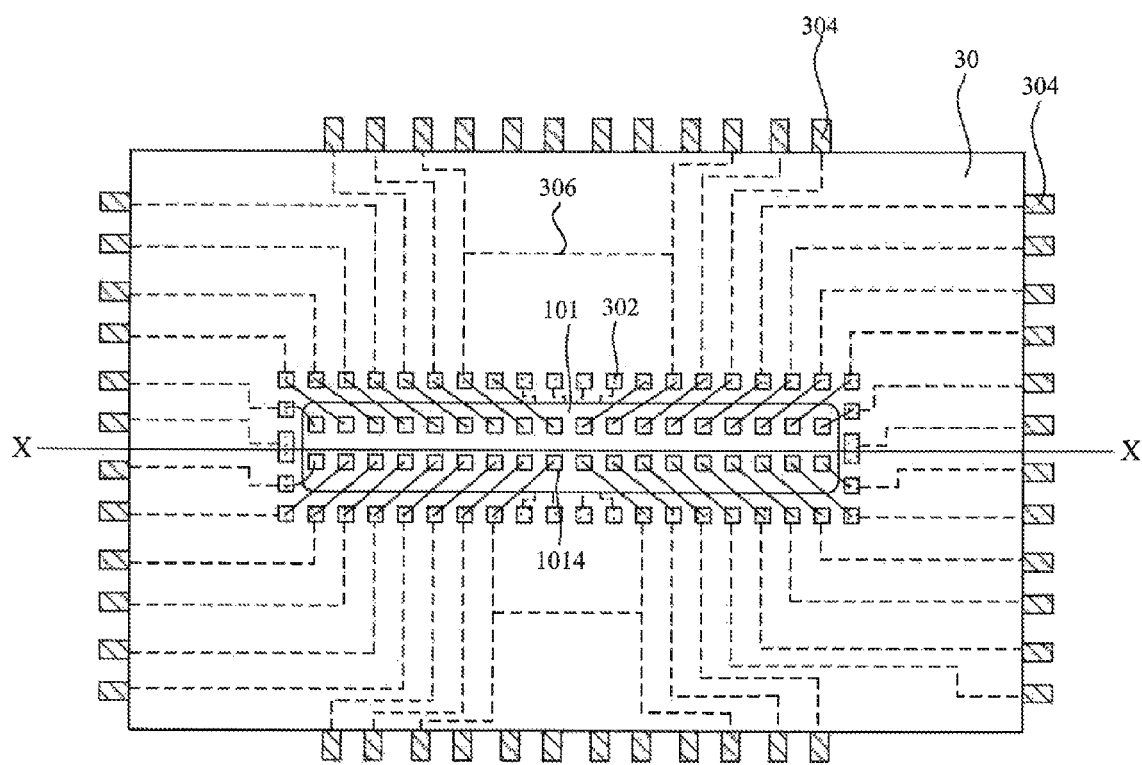
FIG. 6 is a vertical view of FIG. 2A
Figure 7A:
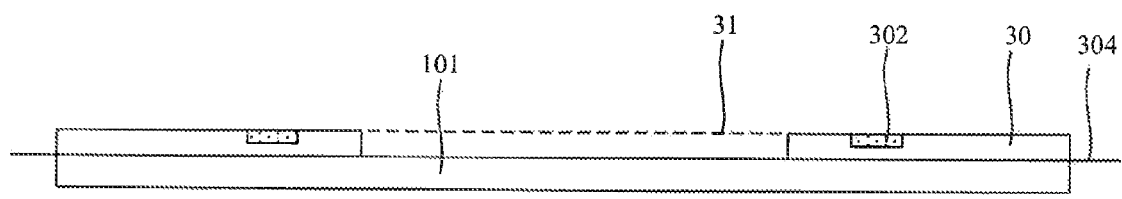
FIG. 7A is a cross-sectional view of X-X direction in FIG. 6.

If the cross-section is in X-X direction in FIG. 6, the packaged substrate 30 with the plurality of external connecting terminals 304 is disposed on the die 101, in which the length of each the plurality of external connecting terminals 304 is larger than that of the one side of the die 101. Due to the FIG. 7A is X-X cross-sectional view of FIG. 6, and thus, FIG. 7A merely shows the packaged substrate 30 and the plurality of connecting terminals 302. The dotted line in FIG. 7A represents the location of the die 101, and thus, the die 101 and the plurality of pads 1014 cannot show in X-X cross-section direction in FIG. 7A.

Figure 7B:
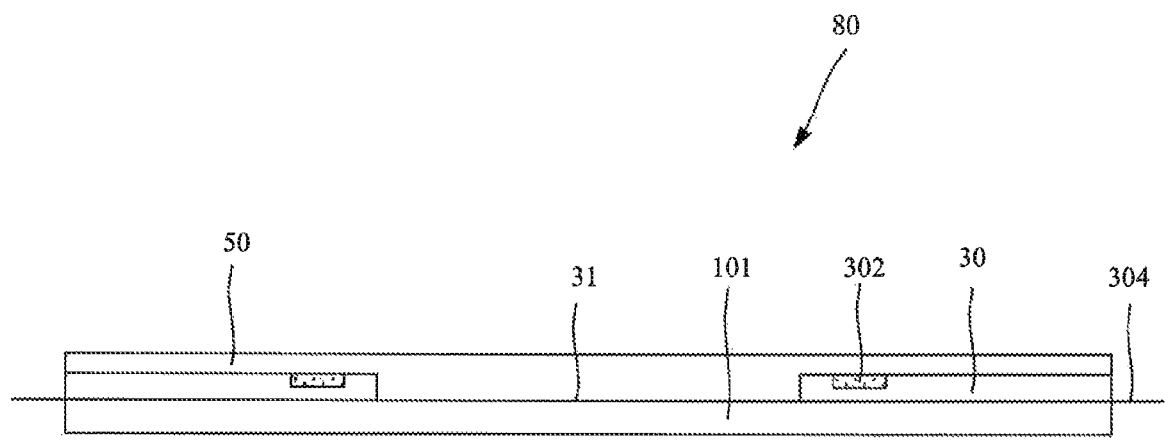
FIG. 7B is a cross-sectional view of a screen-printing process is performed on the structure of FIG. 7A to form a packaged body.

Next, please refer to FIG. 7B. FIG. 7B is a cross-sectional schematic illustrates a packaged body is formed to encapsulate the packaged substrate and the die, and the plurality of external connecting terminals on one side of the packaged substrate region is exposed out of the packaged body. Herein, FIG. 7B is the cross-sectional view of X-X direction in FIG. 6. FIG. 7B merely shows the packaged substrate 30 and the die 101 which is encapsulated by the packaged body 50, and the plurality of external connecting terminals 304 is exposed out of the packaged body 50, but the plurality of pads 1014 of the die 101 and the plurality of second metal wires 40 is electrically connected the packaged substrate region 30 with the die 101 cannot show in FIG. 7B.

Figure 7C:
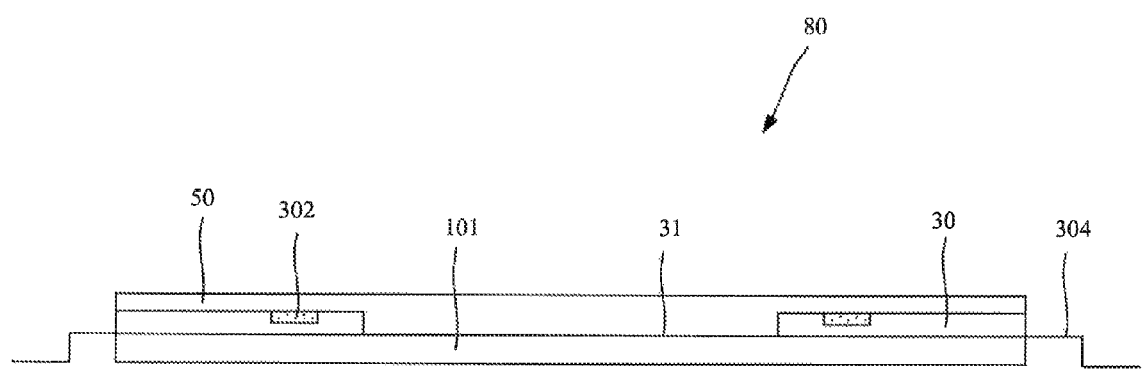
FIG. 7C is a cross-sectional schematic illustrates a stamp process that is performed on a plurality of external connecting terminals to form an inner lead and an outer lead.

Then, please refer to FIG. 7C. FIG. 7C shows a lead frame with an inner lead and an outer lead which is formed by stamping a plurality of external connecting terminals of the packaged substrate region with stamping process. In FIG. 7C, for each the plurality of die packaged structures 80 can electrically connect with other components (not shown), the plurality of external connecting terminals 304 of each the plurality of die packaged structures 80 is stamped to form as a structure of a lead frame with the inner lead and the outer lead. Thus, each the plurality of die packaged structures 80 can electrically connect with external component (not shown) via the inner lead (not shown) and the outer lead (not shown).

Although the present invention has been described with reference to the preferred embodiment thereof, it is apparent to those skilled in the art that a variety of modifications and changes may be made without departing from the scope of the present invention which is intended to be defined by the appended claims.

What is claimed is:
1. A die packaged structure, comprising:
a die, said die having an active surface and a back surface, and a plurality of pads is disposed in a central region of said active surface of said die;
a packaged substrate, said packaged substrate having a front surface and back surface, an opening is disposed in a central region of said packaged substrate, a plurality of connecting terminals is disposed on four sides of said packaged substrate, and said plurality connecting terminals is electrically connected with said plurality of external connecting terminals by a plurality of first metal wires, in which said back surface of said packaged substrate is fixed on said die by an adhesive layer, such that said plurality of pads in said central region of said die is exposed on said opening of said packaged substrate;
a plurality of second metal wires, said plurality of second metal wires is electrically connected said plurality of connecting terminals in said central region of said packaged substrate with said plurality of pads in said central region of said die;
a packaged body, said packaged body is encapsulated said packaged substrate, said die and said plurality of first metal wires and said plurality of external connecting terminals on said packaged substrate being exposed; and
a plurality of conductive components, said plurality of conductive components is electrically connected with said plurality of external terminals and is arranged on said four sides of said packaged substrate, and a height of said plurality of conductive components is identical to a total height of said packaged substrate and said packaged body.

2. The die package structure according to claim 1, wherein said packaged substrate region is a print circuit board.

3. The die package structure according to claim 1, wherein the size of said print circuit board is smaller than that of said die.

4. The die package structure according to claim 1, wherein said packaged substrate region is a flexible print circuit board.

5. The die package structure according to claim 1, wherein the size of said packaged substrate region is smaller than that of said die.

* * * * *